US012796187B2

(12) United States Patent
Yuan et al.

(10) Patent No.: US 12,796,187 B2
(45) Date of Patent: Nov. 10, 2026

(54) DISPLAY PANEL AND SPLICING PANEL

(71) Applicant: TCL China Star Optoelectronics Technology Co., Ltd., Shenzhen (CN)

(72) Inventors: Chunge Yuan, Shenzhen (CN); Kaijun Wang, Shenzhen (CN); Linshuang Li, Shenzhen (CN); Jinyang Wang, Shenzhen (CN); Lixuan Chen, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 984 days.

(21) Appl. No.: 17/992,959

(22) Filed: Nov. 23, 2022

(65) Prior Publication Data

US 2024/0113265 A1 Apr. 4, 2024

(30) Foreign Application Priority Data

Sep. 29, 2022 (CN) ........................ 202211199774.2

(51) Int. Cl.
*H10H 20/853* (2025.01)
*H10W 90/00* (2026.01)

(52) U.S. Cl.
CPC .......... *H10H 20/853* (2025.01); *H10W 90/00* (2026.01)

(58) Field of Classification Search
CPC .. H10H 20/853; H10H 20/854; H10H 29/142; H10W 90/00; G09F 9/33
See application file for complete search history.

(56) References Cited

U.S. PATENT DOCUMENTS

2022/0407040 A1* 12/2022 Yamazaki ............ H10K 59/122
2023/0222947 A1* 7/2023 Lin ........................ G09F 9/3026 257/79
2023/0246142 A1* 8/2023 Chan .................... H10H 20/853 257/88

FOREIGN PATENT DOCUMENTS

CN 105609655 5/2016
CN 209087914 7/2019
WO WO 2020/258271 12/2020

OTHER PUBLICATIONS

Notification of Office Action and Search Report Dated Jun. 16, 2025 From The State Intellectual Property Office of the People's Republic of China Re. Application No. 202211199774.2 and Its Translation Into English. (14 Pages).

* cited by examiner

*Primary Examiner* — Eliseo Ramos Feliciano
*Assistant Examiner* — Thaddeus J Kolb

(57) ABSTRACT

A display panel and a splicing panel are provided. A driving substrate includes a second surface, and the second surface is a side surface of a driving substrate. A second encapsulation structure includes at least one coating layer and at least one adhesive layer. One of the coating layer and the adhesive layer directly covers the second surface of the driving substrate. In a vertical direction of the second surface of the driving substrate, the coating layer and the adhesive layer are alternately arranged, and both the coating layer and the adhesive layer are organic layers. The coating layer and the adhesive layer using organic materials can, flatten a roughness of the second surface, so as to improve an integrity of the coating layer and the adhesive layer, thereby improving an encapsulation performance.

12 Claims, 6 Drawing Sheets

DISPLAY PANEL AND SPLICING PANEL

RELATED APPLICATIONS

This application claims the benefit of priority of Chinese Patent Application No. 202211199774.2 filed on Sep. 29, 2022, the contents of which are incorporated by reference as if fully set forth herein in their entirety.

FIELD AND BACKGROUND OF THE INVENTION

The present disclosure relates to the field of display technologies, in particular to a display panel.

In sub-millimeter (mini) and micrometer (micro) light-emitting diode (LED) panels, thin-film transistors require current to be turned on for panel display. A semiconductor layer of the thin film transistor is very sensitive to oxygen and moisture environment, which will make electrical properties of the thin film transistor unstable and cause abnormality of the panel. Therefore, the panel needs to be encapsulated.

In the prior art, conventional encapsulations include front surface encapsulations and side surface encapsulations. The front surface encapsulation refers to encapsulating a front surface of a driver backplane, which can be encapsulated with a glass. The side surface encapsulation refers to encapsulating a side surface of the driver backplane, which is usually encapsulated with an adhesive. However, a water vapor transmission rate (WVTR) of the adhesive is relatively large, and it needs to be formed thicker. The side surface encapsulation is also encapsulated with an inorganic film layer. However, its encapsulation performance is sometimes good and sometimes bad, and it is not very stable. After a long period of research and a large number of experiments, finally, it is found that a roughness of a side surface of the panel is relatively large (Ra≥1.6 micrometers) after the panel is cut. During inorganic material coating, defects such as cracks and voids are easily generated in the inorganic film layer, which affects the encapsulation performance.

SUMMARY OF THE INVENTION

Embodiments of the present disclosure provide a display panel and a splicing panel, which can solve technical problems that an encapsulation thickness of a side surface of the display panel is large and an encapsulation performance is unsatisfactory when an inorganic film layer is used for encapsulating.

An embodiment of the present disclosure provides a display panel, including:

- a driving substrate including a first surface and a second surface, where an extending direction of the first surface intersects with an extending direction of the second surface, the first surface is a front surface of the driving substrate, and the second surface is a side surface of the driving substrate;
- a light-emitting device disposed on the first surface of the driving substrate;
- a first encapsulation structure covering the first surface, and encapsulating the light-emitting device; and
- a second encapsulation structure including at least one coating layer and at least one adhesive layer, where one of the coating layer and the adhesive layer directly covers the second surface of the driving substrate; in a vertical direction of the second surface of the driving substrate, the coating layer and the adhesive layer are alternately arranged, and both the coating layer and the adhesive layer are organic layers.

Alternatively, in some embodiments of the present disclosure, an outermost layer of the second encapsulation structure is the adhesive layer.

Alternatively, in some embodiments of the present disclosure, a thickness of the coating layer is less than or equal to 50 micrometers.

Alternatively, in some embodiments of the present disclosure, the first encapsulation structure includes a first front encapsulation layer and a second front encapsulation layer, and an elastic modulus of the first front encapsulation layer is less than an elastic modulus of the second front encapsulation layer; the first front encapsulation layer is an organic layer, and the first front encapsulation layer covers the first surface of the driving substrate and encapsulates the light-emitting device.

The coating layer includes a first coating layer, the adhesive layer includes a first adhesive layer, the first coating layer directly covers the second surface of the driving substrate and a side surface of the first front encapsulation layer, and the first coating layer directly covers a surface of the first front encapsulation layer away from the driving substrate.

The second front encapsulation layer is disposed on a surface of the first coating layer away from the driving substrate, and the first adhesive layer covers a side surface of the first coating layer and a side surface of the second front encapsulation layer.

Alternatively, in some embodiments of the present disclosure, the coating layer further includes a second coating layer, and the second coating layer covers at least a side surface of the first adhesive layer and a surface of the second front encapsulation layer away from the driving substrate.

Alternatively, in some embodiments of the present disclosure, the adhesive layer further includes a second adhesive layer, and the second adhesive layer covers a side surface of the second coating layer.

Alternatively, in some embodiments of the present disclosure, the first encapsulation structure includes a first front encapsulation layer and a second front encapsulation layer, an elastic modulus of the first front encapsulation layer is less than an elastic modulus of the second front encapsulation layer, the first front encapsulation layer is an organic layer, and the first front encapsulation layer covers the first surface of the driving substrate and encapsulates the light-emitting device.

The coating layer includes a first coating layer, the adhesive layer includes a first adhesive layer, the first adhesive layer directly covers the second surface of the driving substrate and a side surface of the first front encapsulation layer, and the first coating layer covers at least a side surface of the first adhesive layer and a surface of the first front encapsulation layer away from the driving substrate.

The second front encapsulation layer is disposed on a surface of the first coating layer away from the driving substrate.

Alternatively, in some embodiments of the present disclosure, the coating layer further includes a second coating layer, and the adhesive layer further includes a second adhesive layer.

The second adhesive layer covers a side surface of the first coating layer and a side surface of the second front encapsulation layer, and the second coating layer covers at least a side surface of the second adhesive layer and a surface of the second front encapsulation layer away from the driving substrate.

Alternatively, in some embodiments of the present disclosure, the first encapsulation structure includes a first front encapsulation layer and a second front encapsulation layer, an elastic modulus of the first front encapsulation layer is less than an elastic modulus of the second front encapsulation layer, the first front encapsulation layer is an organic layer, the first front encapsulation layer covers the first surface of the driving substrate and encapsulates the light-emitting device, and the second front encapsulation layer covers a surface of the first front encapsulation layer away from the driving substrate.

The coating layer includes a first coating layer, the adhesive layer includes a first adhesive layer, the first coating layer directly covers the second surface of the driving substrate and a side surface of the first front encapsulation layer, and the first adhesive layer covers a side surface of the first coating layer.

Alternatively, in some embodiments of the present disclosure, a surface roughness of the coating layer and a surface roughness of the adhesive layer are both less than a surface roughness of the second surface.

Correspondingly, an embodiment of the present disclosure further provides a splicing panel, which includes at least two of the display panels according to any one of the above embodiments, and the display panels are spliced.

The display panel of the embodiments of the present disclosure includes the driving substrate, the light-emitting device, the first encapsulation structure, and the second encapsulation structure. The driving substrate includes a first surface and a second surface. The first surface intersects with the second surface, the first surface is a front surface of the driving substrate, and the second surface is a side surface of the driving substrate. The light-emitting device is disposed on the first surface of the driving substrate. The first encapsulation structure covers the first surface and encapsulates the light-emitting device. The second encapsulation structure includes at least one coating layer and at least one adhesive layer. One of the coating layer and the adhesive layer directly covers the second surface of the driving substrate. In a vertical direction of the second surface of the driving substrate, the coating layer and the adhesive layer are alternately arranged, and both the coating layer and the adhesive layer are organic layers.

In the display panel of the embodiments of the present disclosure, a cutting process of the panel makes a roughness of the second surface (the side surface) of the driving substrate larger. Thus, the coating layer and the adhesive layer using organic materials can, on the one hand, flatten the roughness of the second surface, so as to improve an integrity of the coating layer and the adhesive layer, and further improve the encapsulation performance. On the other hand, the two are alternately arranged to be closely connected, which can further improve the encapsulation performance. In addition, a setting of the coating layer can also reduce a thickness of the second encapsulation structure. The adhesive layer can also absorb external stress for protecting the coating layer.

BRIEF DESCRIPTION OF THE SEVERAL VIEWS OF THE DRAWINGS

In order to illustrate the technical solutions in the embodiments of the present disclosure more clearly, the following briefly introduces the accompanying drawings required for the description of the embodiments. Obviously, the drawings in the following description are only some examples of the present disclosure. For those skilled in the art, other drawings can also be obtained from these drawings without creative efforts.

DESCRIPTION OF SPECIFIC EMBODIMENTS OF THE INVENTION

The technical solutions in the embodiments of the present disclosure will be clearly and completely described below with reference to the accompanying drawings in the embodiments of the present disclosure. Obviously, the described embodiments are only some, but not all, embodiments of the present disclosure. Based on the embodiments in the present disclosure, all other embodiments obtained by those skilled in the art without creative efforts shall fall within the protection scope of the present disclosure. Furthermore, it should be understood that the specific embodiments described herein are only used to illustrate and explain the present disclosure, and not to limit the present disclosure. In the present disclosure, if contrary circumstances are not stated, directional terms, such as "up" and "down", usually refer to the actual use or working condition of the device, especially the directions shown in the accompanying drawings, while the terms "inside" and "outside" refer to an outlook of the device.

Embodiments of the present disclosure provide a display panel and a splicing panel, which will be described in detail below. It should be noted that the description order of the following embodiments is not intended to limit the preferred order of the embodiments.

Figure 1:
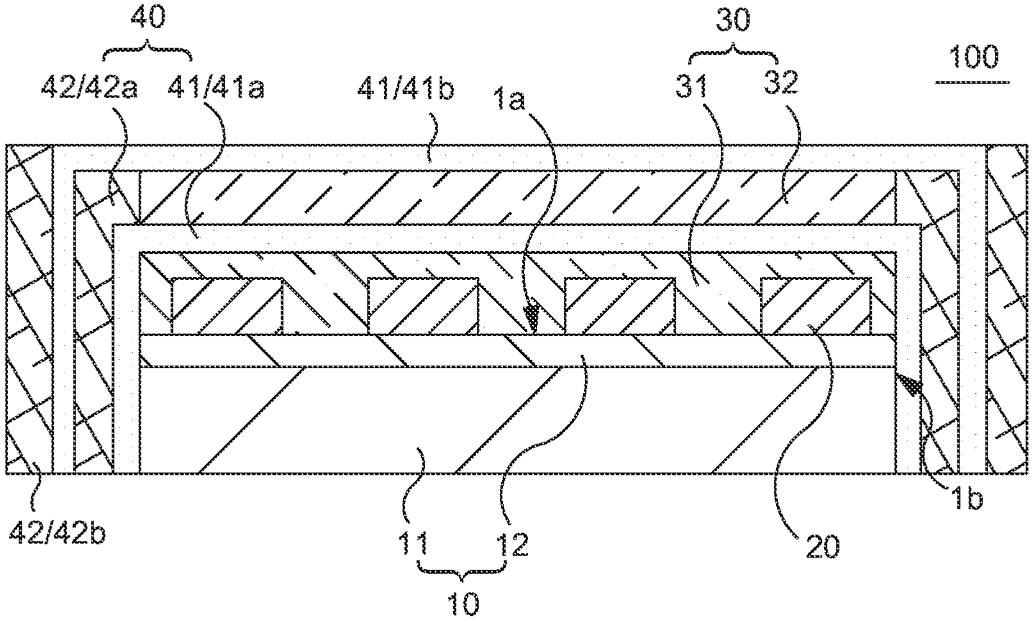
FIG. 1 is a schematic structural diagram of a display panel provided by a first embodiment of the present disclosure.

Referring to FIG. 1, a first embodiment of the present disclosure provides a display panel 100 including a driving substrate 10, a light-emitting device 20, a first encapsulation structure 30, and a second encapsulation structure 40. The driving substrate 10 includes a first surface 1*a* and a second surface 1*b*, and an extending direction of the first surface 1*a* intersects with an extending direction of the second surface 1*b*. The first surface 1*a* is a front surface of the driving substrate 10. The second surface 1*b* is a side surface of the driving substrate 10. The light-emitting device 20 is disposed on the first surface of the driving substrate 10. The first encapsulation structure layer 30 covers the first surface 1*a* and encapsulates the light-emitting device 20. The second encapsulation structure 40 includes at least one coating layer 41 and at least one adhesive layer 42, and one of the coating layer 41 and the adhesive layer 42 directly covers the second surface 1*b* of the driving substrate 10.

In a vertical direction of the second surface 1*b* of the driving substrate 10, the coating layer 41 and the adhesive layer 42 are alternately arranged. Both the coating layer 41 and the adhesive layer 42 are organic layers.

In the display panel 100 of the first embodiment of the present disclosure, a cutting process is performed in a manufacturing process of the panel, so that a roughness of the second surface 1*b* (the side surface) of the driving substrate 10 is relatively large. Thus, the coating layer 41 and the adhesive layer 42 using organic materials can, on the one hand, flatten the roughness of the second surface 1*b*, so as to improve an integrity of the coating layer 41 and the adhesive layer 42, and further improve an encapsulation performance. On the other hand, the two are alternately arranged to be closely connected, which can further improve the encapsulation performance. In addition, the setting of the coating layer 41 can also reduce a thickness of the second encapsulation structure 40. The adhesive layer 42 can also absorb external stress for protecting the coating layer 41.

Alternatively, a number of the coating layers 41 may be one layer, two layers, or more than three layers. A number of the adhesive layers 42 can also be one layer, two layers, or more than three layers.

Alternatively, a surface roughness of the coating layer 41 and a surface roughness of the adhesive layer 42 are both less than a surface roughness of the second surface 1*b*.

Since the second surface 1*b* is formed in the cutting process, it has a relatively large surface roughness. For example, the surface roughness Ra of the second surface 1*b* is greater than or equal to 1.6 micrometers. In the first embodiment, the organic material is formed on the second surface 1*b*, so that the organic material can well fill unevenness of the second surface 1*b* without causing cracks, thus achieving a purpose of improving the encapsulation performance. In addition, due to the flatness of the organic material, the surface roughness of the coating layer 41 and the adhesive layer 42 can be reduced.

Alternatively, the coating layer 41 may be formed by a physical vapor deposition process, a chemical vapor deposition process, or an atomic layer deposition process. The adhesive layer 42 is generally formed by dot coating, spin coating, spray coating, or transfer printing.

Therefore, under a condition of the coating layer 41 and the adhesive layer 42 having a same thickness, the encapsulation performance of the coating layer 41 is stronger than that of the adhesive layer 42. Therefore, using the coating layer 41 to encapsulate the side surface of the driving substrate 10 can achieve an effect of reducing a thickness the second encapsulation structure 40 compared with the prior art encapsulation method using only the adhesive layer.

Alternatively, a thickness of the coating layer 41 is less than or equal to 50 micrometers. The thickness of the coating layer 41 may be 1 micrometer, 5 micrometers, 10 micrometers, 15 micrometers, 20 micrometers, 25 micrometers, 30 micrometers, 35 micrometers, 40 micrometers, 45 micrometers, or 50 micrometers.

It should be noted that, during deposition and formation of the coating layer, there is internal stress inside the coating layer. As a thickness of the coating layer increases, its internal stress increases. When the internal stress is greater than a bonding force of the coating layer itself, cracks will occur, thereby affecting the encapsulation performance of the coating layer.

According to experimental tests, when the thickness of the coating layer 41 is greater than 30 micrometers, the cracks are generated in the coating layer 41. When the thickness of the coating layer 41 is between 30 micrometers and 50 micrometers, the encapsulation performance of the coating layer 41 increases with the increase of the thickness, but the increase of the performance tends to decrease. When the thickness of the coating layer 41 is greater than 50 micrometers, the encapsulation performance of the coating layer 41 decreases.

In addition, as the thickness of the coating layer 41 increases, the longer the time to form the coating layer 41, the higher the cost.

Therefore, the thickness of the coating layer 41 is less than or equal to 50 micrometers, which can improve the encapsulation performance and prevent a film formation time from being too long.

Alternatively, the thickness of the coating layer 41 is greater than 1 micrometer and less than or equal to 30 micrometers. With such an arrangement, the coating layer 41 with better encapsulation performance can be formed in a short time, and a thickness of the second encapsulation structure layer 40 can be reduced.

Alternatively, the thickness of the coating layer 41 is greater than 1 micrometer and less than or equal to 10 micrometers. Such an arrangement further saves the film formation time and reduces the thickness.

Alternatively, a water vapor transmission rate (WVTR) of the coating layer 41 is less than 5 g·25 um/g. Specifically, the WVTR is a value measured after 24 hours under conditions of 40 degrees Celsius and 90% humidity.

Alternatively, the organic material of the coating layer 41 may be parylene or the like.

Alternatively, an outermost layer of the second encapsulation structure 40 is an adhesive layer 42. Using the adhesive layer 42 as the outermost layer of the second encapsulation structure 40 can buffer external stress. For example, when a periphery of the display panel 100 is bumped and scratched, the adhesive layer 42 absorbs stress and protects it.

Alternatively, an organic polymer material of the adhesive layer 42 may be silica gel, epoxy resin system, acrylic resin system, or polyurethane. The adhesive layer 42 can be formed by UV curing or thermal curing.

Alternatively, a thickness of the adhesive layer 42 is between 50 micrometers and 500 micrometers, such as 50 micrometers, 100 micrometers, 200 micrometers, 300 micrometers, 400 micrometers, or 500 micrometers.

Alternatively, the thickness of the adhesive layer 42 is less than or equal to 200 micrometers. It can reduce curing time and reduce a thickness of film layers.

Alternatively, in this first embodiment, the first encapsulation structure 30 includes a first front encapsulation layer 31 and a second front encapsulation layer 32. An elastic modulus of the first front encapsulation layer 31 is less than an elastic modulus of the second front encapsulation layer 32. The first front encapsulation layer 31 is an organic layer.

The first front encapsulation layer 31 covers the first surface 1*a* of the driving substrate 10 and encapsulates the light-emitting device 20.

The coating layer 41 includes a first coating layer 41*a*. The adhesive layer 42 includes a first adhesive layer 42*a*. The first coating layer 41*a* directly covers the second surface 1*b* of the driving substrate 10 and a side surface of the first front encapsulation layer 31. The first coating layer 41*a* covers a surface of the first front encapsulation layer 31 away from the driving substrate 10.

The second front encapsulation layer 32 is disposed on a surface of the first coating layer 41*a* away from the driving substrate 10. The first adhesive layer 42*a* covers a side surface of the first coating layer 41*a* and a side surface of the second front encapsulation layer 32.

In the first embodiment, the first coating layer 41*a* directly covers the second surface 1*b* of the driving substrate 10 and the side surface of the first front encapsulation layer 31. That is, the first coating layer 41*a* is used to encapsulate the side surface (the second surface 1*b*) of the driving substrate 10 to block moisture. Since the first coating layer 41*a* is a coating layer, the first coating layer 41*a* can fill uneven areas of the side surface of the driving substrate 10, maintain an integrity of the film formation, and make the first coating layer 41*a* flat. A surface roughness Ra of the first coating layer 41*a* is less than or equal to 0.05 μm.

In the first embodiment, encapsulating the light-emitting device 20 with the first front encapsulation layer 31 of organic material can not only fix the light-emitting device 20, but also encapsulate the light-emitting device 20 and the front surface (the first surface 1*a*) of the driving substrate 10.

Alternatively, material of the first front encapsulation layer 31 is an organic resin material, such as silica gel, epoxy glue, acrylic, or polyurethane. Alternatively, a thickness of the first front encapsulation layer 31 is between 200 micrometers and 300 micrometers, such as 200 micrometers, 250 micrometers, or 300 micrometers.

Furthermore, the thickness of the first front encapsulation layer 31 is between 1.2 times and 2 times a height of the light-emitting device 20, such as 1.2 times, 1.3 times, 1.5 times, 1.7 times, 1.8 times, or 2 times.

It can be understood that the larger the thickness of the first front encapsulation layer 31, the better the encapsulation performance the light-emitting device 20 and the driving substrate 10, but the weaker the light transmittance. Therefore, a value range of the thickness of the first front encapsulation layer 31 needs to satisfy both the encapsulation performance and the setting of the light transmittance. When the thickness of the first front encapsulation layer 31 is 1.5 times the height of the light-emitting device 20, the encapsulation performance and light transmittance are optimized.

Alternatively, the light transmittance of the first front encapsulation layer 31 is greater than 90%, such as 91%, 95%, or 98%.

In the first embodiment, since a portion of the first coating layer 41*a* covers the first front encapsulation layer 31, a light transmittance of the first coating layer 41*a* needs to be greater than 95%, such as 96%, 98%, or 99%. In addition, since the first coating layer 41*a* is a coating layer and the first front encapsulation layer 31 is an adhesive material, a bonding between the first coating layer 41*a* and the first front encapsulation layer 31 is tighter, and the encapsulation performance is better. According to a cross-cut test standard, a rating of the adhesion between the first coating layer 41*a* and the first front encapsulation layer 31 reaches 5B.

In the first embodiment, the second front encapsulation layer 32 with higher hardness is used as an outer layer to protect the display panel 100. In addition, since the elastic modulus of the second front encapsulation layer 32 is greater than that of the first front encapsulation layer, the second front encapsulation layer 32 has better moisture barrier capability.

Alternatively, material of the second front encapsulation layer 32 may be glass or a barrier film, etc. A light transmittance of the second front encapsulation layer 32 is greater than 90%, such as 91%, 95%, or 98%.

In the first embodiment, the first adhesive layer 42*a* covers the side surface of the first coating layer 41*a* and the side surface of the second front encapsulation layer 32. The side surface (the second surface 1*b*) of the driving substrate 10 is encapsulated for the second time by using the first adhesive layer 42*a* to improve the encapsulation performance. In addition, using the first adhesive layer 42*a* to cover the side surface of the second front encapsulation layer 32 not only improves the stability of the second front encapsulation layer 32, but also improves an overall encapsulation performance of the display panel 100.

Alternatively, in the display panel 100 of the first embodiment, compared with the above structure, the coating layer 41 may further include a second coating layer 41*b*. The second coating layer 41*b* covers at least a side surface of the first adhesive layer 42*a* and a surface of the second front encapsulation layer 32 away from the driving substrate 10.

That is, the number of coating layers 41 is at least two layers. In the vertical direction of the second surface 1*b*, the first coating layer 41*a* and the second coating layer 41*b* are bonded by the first adhesive layer 42*a*. It should be noted that, since the first coating layer 41*a* and the second coating layer 41*b* are the coating layers 41, the thicknesses of the two are not as thick as possible. Therefore, using the first adhesive layer 42*a* as an intermediate adhesive layer not only greatly improves the encapsulation performance, but also improves an adhesive force.

For example, a total thickness of the coating layer 41 is 60 micrometers, and the thickness of the adhesive layer 42 is 200 micrometers. Under conditions that the total thickness of the coating layer 41 and the total thickness of the adhesive layer 42 remain unchanged, comparing "the single 60-micron coating layer 41 being stacked with the adhesive layer 42" with "the adhesive layer 42 being disposed between two layers of 30-micron coating layers 41", the encapsulation performance of the latter is stronger than that of the former.

Alternatively, according to a cross-cut test standard, a rating of the adhesion between the second coating layer 41*b* and the second front encapsulation layer 32 reaches 5B.

In some embodiments, the second coating layer 41*b* may not cover the surface of the second front encapsulation layer 32 away from the driving substrate 10.

Alternatively, in the display panel 100 of the first embodiment, compared with the above structure, the adhesive layer 42 further includes a second adhesive layer 42*b*, and the second adhesive layer 42*b* covers a side surface of the second coating layer 41*b*.

That is, the number of adhesive layers 42 is at least two layers. The second adhesive layer 42*b* is used to encapsulate the side surface of the driving substrate 10 for the fourth time, which improves the encapsulation performance and further protects the side surface of the display panel 100.

Figure 2:
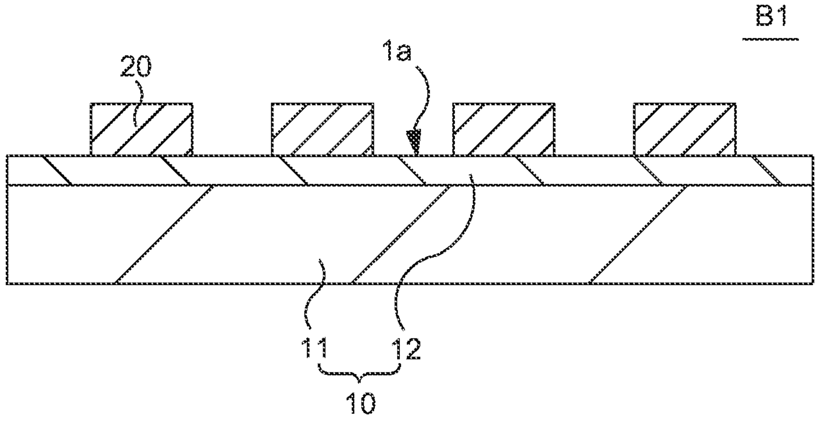
FIG. 2 is a schematic diagram illustrating a manufacturing step B1 of the display panel provided by the first embodiment of the present disclosure.

A manufacturing process of the display panel 100 of the first embodiment are as follows:

Referring to FIG. 2, in step B1, a plurality of light-emitting devices 20 are bound to the driving substrate 10.

The driving substrate 10 includes a base 11 and a thin film transistor array layer 12 disposed on the base 11. Material of an active layer in the thin film transistor may be a-Si, IGZO, IGTO, LTPS, and the like. Alternatively, the thin film transistor may have a top gate, bottom gate, or double-gate structure.

Alternatively, material of the base 11 may be a rigid substrate or a flexible substrate. The material of the substrate 11 includes one of glass, sapphire, silicon, silicon dioxide, polyethylene, polypropylene, polystyrene, polylactic acid, polyethylene dicarboxylate, polyethylene terephthalate, polyethylene naphthalate, polycarbonate, polyethersulfone, aromatic fluorotoluene containing polyarylate, polycyclic olefin, polyimide, or polyurethane Alternatively, the light-emitting device 20 may be a sub-millimeter light-emitting diode (mini-LED), a micro light-emitting diode (micro-LED), a quantum dot light-emitting diode, an organic light-emitting diode, or the like.

In the first embodiment, the light-emitting devices 20 can be transferred to the driving substrate 10 by using a SMT (surface mounting technology) or a mass transfer process.

A step B2 is then performed.

Figure 3:
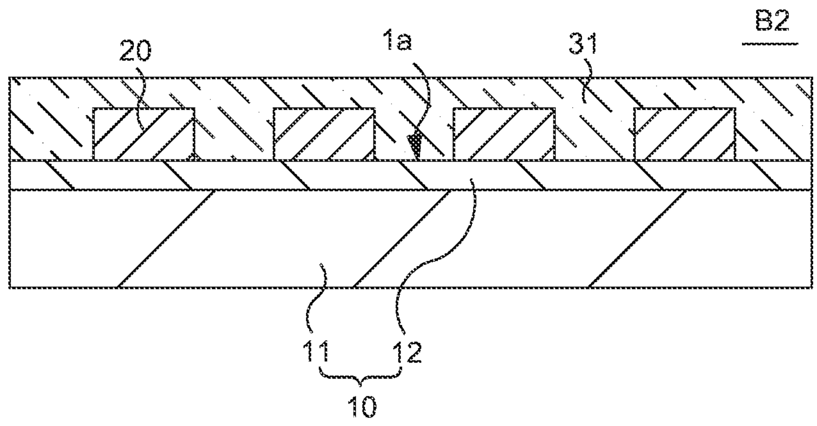
FIG. 3 is a schematic diagram illustrating a manufacturing step B2 of the display panel provided by the first embodiment of the present disclosure.

Referring to FIG. 3, in the step B2, a first front encapsulation layer 31 is formed on the driving substrate 10.

The first front encapsulation layer 31 may be formed by spray coating, spin coating, slot coating, or molding. The first front encapsulation layer 31 encapsulates the light-emitting devices 20.

A step B3 is then performed.

Figure 4:
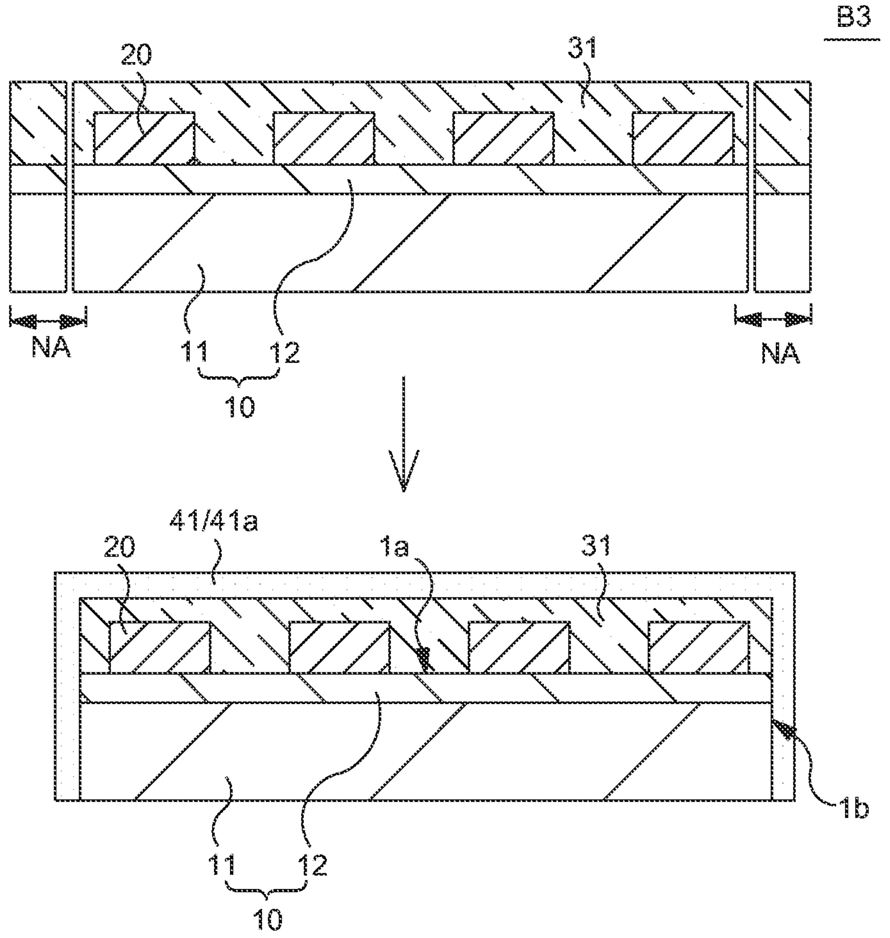
FIG. 4 is a schematic diagram illustrating a manufacturing step B3 of the display panel provided by the first embodiment of the present disclosure.

Referring to FIG. 4, in the step B3, a portion of a bezel area NA of the driving substrate 10 is cut, and then a first coating layer 41*a* is formed on the driving substrate 10. The first coating layer 41*a* covers a side surface of the driving substrate 10 and an exposed surface of the first front encapsulation layer 31.

In some embodiments, the first coating layer 41*a* may only cover the side surface of the driving substrate 10 and the side surface of the first front encapsulation layer 31.

The bezel area NA is cut out to reduce a bezel width. A method, such as physical vapor deposition, chemical vapor deposition, or atomic layer deposition, is sequentially performed to form a first layer of the coating layer 41 (the first coating layer 41*a*).

The first front encapsulation layer 31 also covers the bezel area NA. During cutting, a part of the first front encapsulation layer 31 is also cut off, so that both the side surface of the driving substrate 10 and the side surface of the first front encapsulation layer 31 form rough surfaces.

Alternatively, an organic material of the first coating layer 41*a* may be parylene.

A rating of the adhesion between the first coating layer 41*a* and the first front encapsulation layer 31 is 5B.

A step B4 is then performed.

Figure 5:
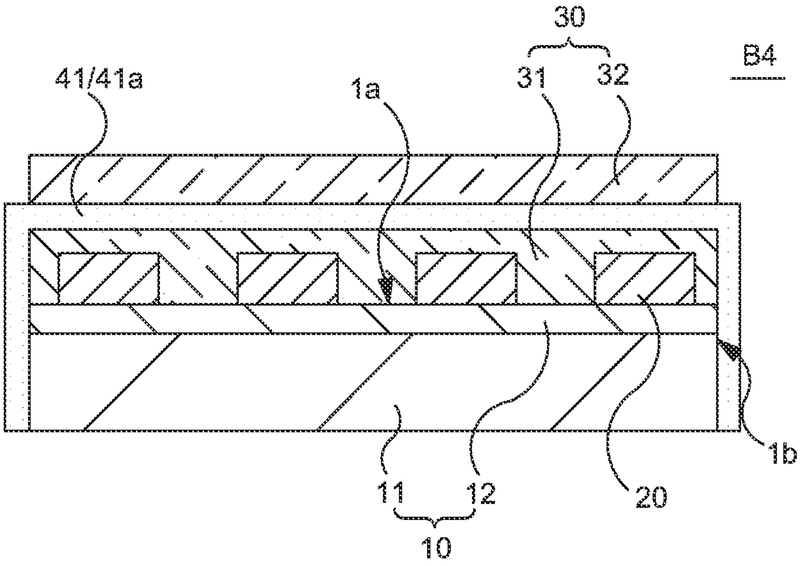
FIG. 5 is a schematic diagram illustrating a manufacturing step B4 of the display panel provided by the first embodiment of the present disclosure.

Referring to FIG. 5, in the step B4, a second front encapsulation layer 32 is disposed on a surface of the first front encapsulation layer 31 away from the driving substrate 10. The second front encapsulation layer 32 is attached to the first coating layer 41*a*.

Material of the second front encapsulation layer 32 may be glass or a barrier film. It is attached to the first coating layer 41*a* by means of lamination. A step B5 is then performed.

Figure 6:
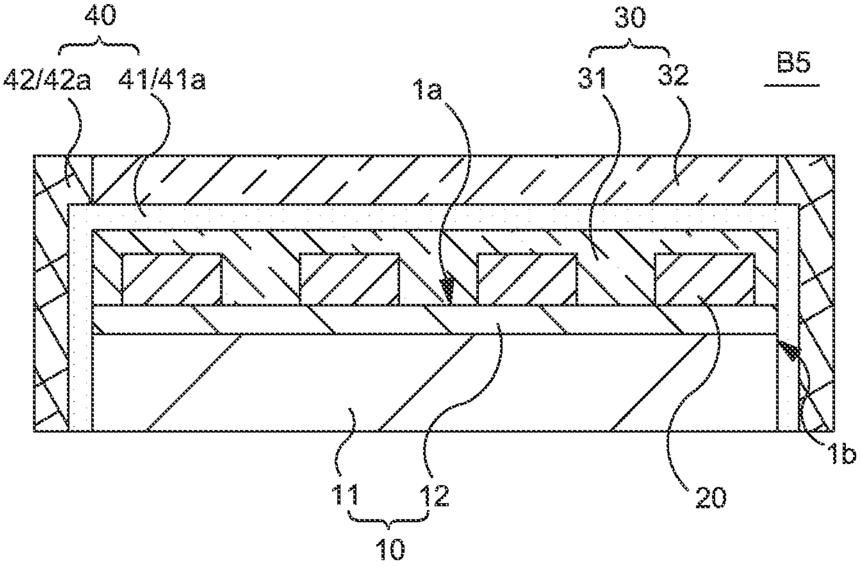
FIG. 6 is a schematic diagram illustrating a manufacturing step B5 of the display panel provided by the first embodiment of the present disclosure.

Referring to FIG. 6, in the step B5, a first adhesive layer 42*a* is formed on side surfaces of the first coating layer 41*a* and the second front encapsulation layer 32.

The first layer of the adhesive layer 42 (the first adhesive layer 42*a*) can be formed by means of spot coating, spray coating, spin coating, or transfer printing, and then the first adhesive layer 42*a* is cured by means of ultraviolet light curing or thermal curing.

A thickness of the first adhesive layer 42*a* is greater than a thickness of the first coating layer 41*a* to better protect the first coating layer 41*a*. A step B6 is then performed.

Figure 7:
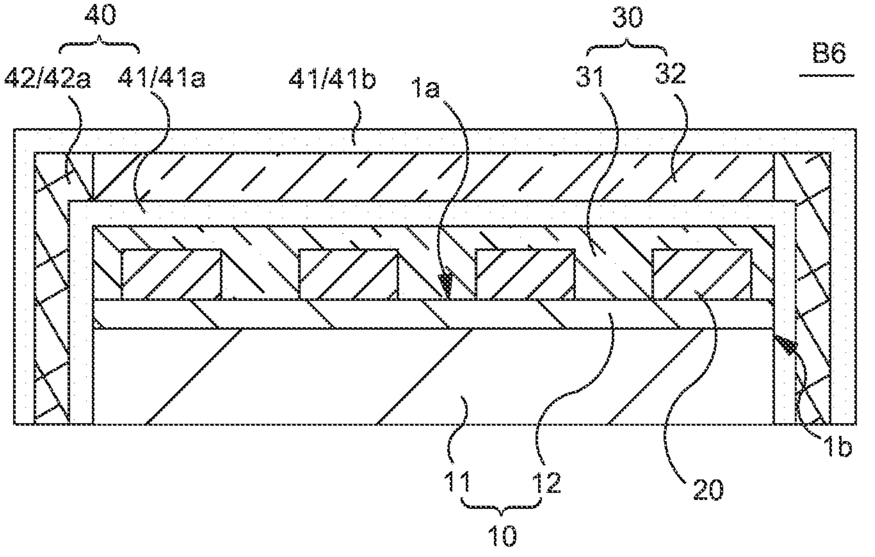
FIG. 7 is a schematic diagram illustrating a manufacturing step B6 of the display panel provided by the first embodiment of the present disclosure.

Referring to FIG. 7, in the step B6, a second coating layer 41*b* is formed on the second front encapsulation layer 32 and the first adhesive layer 42*a*. The second coating layer 41*b* covers a side surface of the first adhesive layer 42*a* and a surface of the second front encapsulation layer 32 away from the driving substrate 10.

The second layer of the coating layer 41 (the second coating layer 41*b*) may be formed by methods such as physical vapor deposition, chemical vapor deposition, or atomic layer deposition. A step B7 is then performed.

Figure 8:
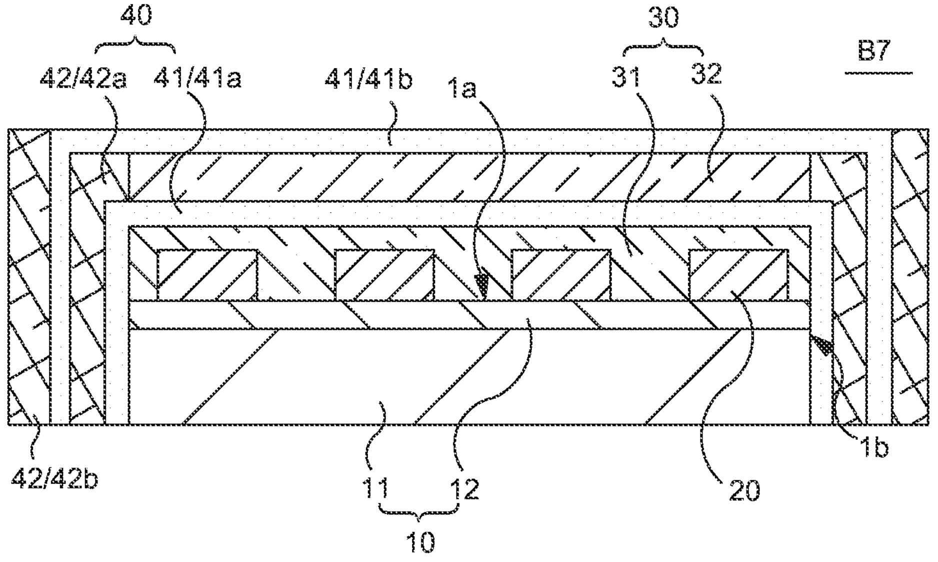
FIG. 8 is a schematic diagram illustrating a manufacturing step B7 of the display panel provided by the first embodiment of the present disclosure.

Referring to FIG. 8, in the step B7, a second adhesive layer 42*b* is formed on a side surface of the second coating layer 41*b*.

The second layer of the adhesive layer 42 (the second adhesive layer 42*b*) can be formed by means of spot coating, spray coating, spin coating, or transfer printing, and then the second adhesive layer 42*b* is cured by means of ultraviolet light curing or thermal curing.

In this way, the manufacturing process of the display panel 100 of the first embodiment is completed.

Figure 9:
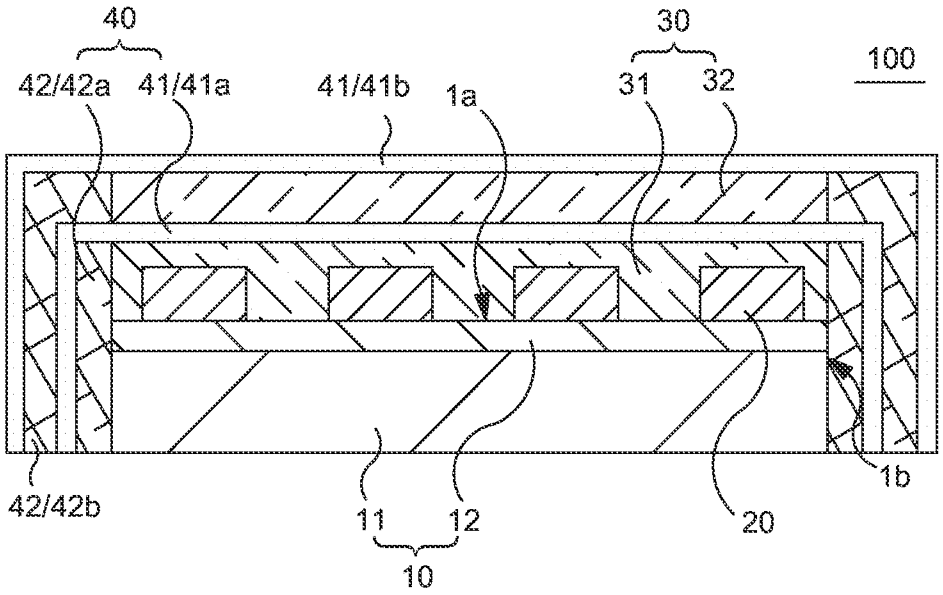
FIG. 9 is a schematic structural diagram of a display panel provided by a second embodiment of the present disclosure.

Referring to FIG. 9, a display panel 100 of a second embodiment includes a driving substrate 10, a light-emitting device 20, a first encapsulation structure 30, and a second encapsulation structure 40. The driving substrate 10 includes a first surface 1*a* and a second surface 1*b*, and an extending direction of the first surface 1*a* intersects with an extending direction of the second surface 1*b*. The first surface 1*a* is a front surface of the driving substrate 10. The second surface 1*b* is a side surface of the driving substrate 10. The light-emitting device 20 is disposed on the first surface of the driving substrate 10. The first encapsulation structure 30 covers the first surface 1*a* and encapsulates the light-emitting device 20. The second encapsulation structure 40 includes at least one coating layer 41 and at least one adhesive layer 42, and one of the coating layer 41 and the adhesive layer 42 directly covers the second surface 1*b* of the driving substrate 10.

In a vertical direction of the second surface 1*b* of the driving substrate 10, the coating layer 41 and the adhesive layer 42 are alternately arranged. Both the coating layer 41 and the adhesive layer 42 are organic layers.

In the second embodiment, the first encapsulation structure 30 includes a first front encapsulation layer 31 and a second front encapsulation layer 32. An elastic modulus of the first front encapsulation layer 31 is less than an elastic modulus of the second front encapsulation layer 32. The first front encapsulation layer 31 is an organic layer. The first front encapsulation layer 31 covers the first surface 1*a* of the driving substrate 10 and encapsulates the light-emitting device 20.

The coating layer 41 includes a first coating layer 41*a*. The adhesive layer 42 includes a first adhesive layer 42*a*.

A difference between the second embodiment and the first embodiment is that the first adhesive layer 42*a* directly covers the second surface 1*b* of the driving substrate 10 and a side surface of the first front encapsulation layer 31. The first coating layer 41*a* covers at least the side surface of the first adhesive layer 42*a* and a surface of the first front encapsulation layer 31 away from the driving substrate 10.

The second front encapsulation layer 32 is disposed on a surface of the first coating layer 41*a* away from the driving substrate 10.

In the display panel 100 of the second embodiment, the adhesive layer 42 is used to directly encapsulate the side surfaces of the driving substrate 10 and the first front encapsulation layer 31, and then the coating layer 41 is used to cover at least the side surface of the adhesive layer 42 to encapsulate the side surface of the driving substrate 10 for the second time.

Since the adhesive layer 42 has certain fluidity and leveling properties, the first adhesive layer 42*a* is used to encapsulate the side surface of the driving substrate 10, unevenness of the side surface of the driving substrate 10 can be quickly filled, and a better flat surface can be provided for the first coating layer 41*a*, which is more conducive to the integrity of the first coating layer 41*a*.

Alternatively, the coating layer 41 may further include a second coating layer 41*b*. The adhesive layer 42 may also include a second adhesive layer 42*b*.

The second adhesive layer 42*b* covers a side surface of the first coating layer 41*a* and a side surface of the second front encapsulation layer 32. The second coating layer 41*b* covers at least a side surface of the second adhesive layer 42*b* and a surface of the second front encapsulation layer 32 away from the driving substrate 10.

Figure 10:
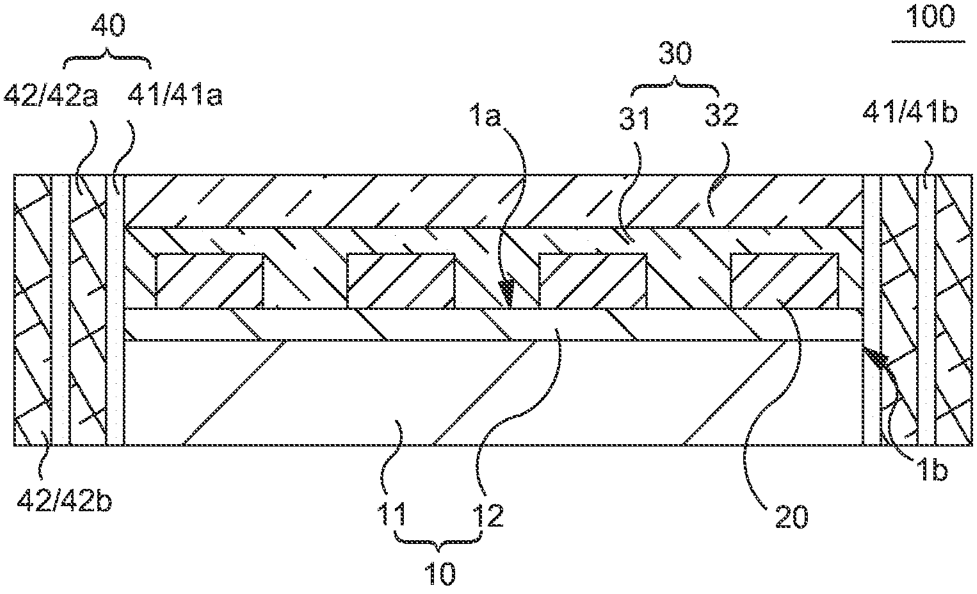
FIG. 10 is a schematic structural diagram of a display panel provided by a third embodiment of the present disclosure.

Referring to FIG. 10, the display panel 100 of the third embodiment includes a driving substrate 10, a light-emitting device 20, a first encapsulation structure 30, and a second encapsulation structure 40. The driving substrate 10 includes a first surface 1*a* and a second surface 1*b*, and an extending direction of the first surface 1*a* intersects with an extending direction of the second surface 1*b*. The first surface 1*a* is a front surface of the driving substrate 10. The second surface 1*b* is a side surface of the driving substrate 10. The light-emitting device 20 is disposed on the first surface of the driving substrate 10. The first encapsulation structure layer 30 covers the first surface 1*a* and encapsulates the light-emitting device 20. The second encapsulation structure 40 includes at least one coating layer 41 and at least one adhesive layer 42, and one of the coating layer 41 and the adhesive layer 42 directly covers the second surface 1*b* of the driving substrate 10.

In the vertical direction of the second surface 1*b* of the driving substrate 10, the coating layer 41 and the adhesive layer 42 are alternately arranged. Both the coating layer 41 and the adhesive layer 42 are organic layers.

In the third embodiment, the first encapsulation structure 30 includes a first front encapsulation layer 31 and a second front encapsulation layer 32. An elastic modulus of the first front encapsulation layer 31 is less than an elastic modulus of the second front encapsulation layer 32. The first front encapsulation layer 31 is an organic layer. The first front encapsulation layer 31 covers the first surface 1*a* of the driving substrate 10 and encapsulates the light-emitting device 20.

The coating layer 41 includes a first coating layer 41*a*. The adhesive layer 42 includes a first adhesive layer 42*a*.

A difference between the display panel 100 of the third embodiment and the first embodiment is that the second front encapsulation layer 32 directly covers a surface of the first front encapsulation layer 31 away from the driving substrate 10.

The first coating layer 41*a* directly covers the second surface 1*b* of the driving substrate 10 and a side surface of the first front encapsulation layer 31. The first adhesive layer 42*a* covers a side surface of the first coating layer 41*a*.

Alternatively, the coating layer 41 may further include a second coating layer 41*b*. The adhesive layer 42 may also include a second adhesive layer 42*b*. The second coating layer 41*b* covers a side surface of the first adhesive layer 42*a*. The second adhesive layer 42*b* covers a side surface of the second coating layer 41*b*.

Compared with the first embodiment, the second encapsulation structure 40 in the third embodiment only encapsulates the side surface of the driving substrate, so as to improve a light transmittance of the display panel 100.

Figure 11:
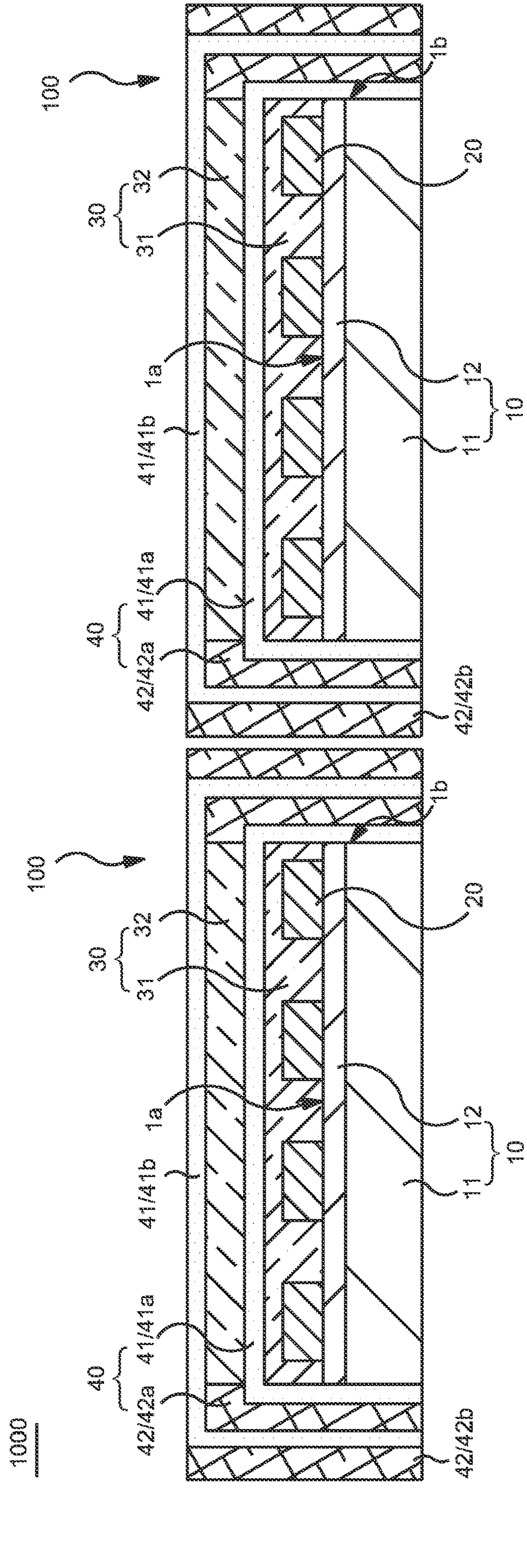
FIG. 11 is a schematic structural diagram of a splicing panel provided by an embodiment of the present disclosure.

Referring to FIG. 11, correspondingly, an embodiment of the present disclosure further provides a splicing panel 1000, which includes at least two display panels 100 according to any of the above-mentioned embodiments, and the display panels 100 are spliced.

It should be noted that the structure of the display panels 100 of the splicing panel 1000 of this embodiment is similar to or the same as the structure of the display panel 100 of any of the above-mentioned embodiments. For details, please refer to the description of the above-mentioned embodiments, which will not be repeated here.

In addition, FIG. 11 takes the display panel 100 of the first embodiment as an example, but it is not limited to this. For example, it may be the display panel of the second embodiment or the display panel of the third embodiment.

In the splicing panel 1000 of the embodiment of the present disclosure, the display panel 100 includes a driving substrate 10, a light-emitting device 20, a first encapsulation structure 30, and a second encapsulation structure 40. The driving substrate 10 includes a first surface 1*a* and a second surface 1*b*, and an extending direction of the first surface 1*a* intersects with an extending direction of the second surface 1*b*. The first surface 1*a* is a front surface of the driving substrate 10. The second surface 1*b* is a side surface of the driving substrate 10. The light-emitting device 20 is disposed on the first surface of the driving substrate 10. The first encapsulation structure layer 30 covers the first surface 1*a* and encapsulates the light-emitting device 20. The second encapsulation structure 40 includes at least one coating layer 41 and at least one adhesive layer 42, and one of the coating layer 41 and the adhesive layer 42 directly covers the second surface 1*b* of the driving substrate 10.

In the vertical direction of the second surface 1*b* of the driving substrate 10, the coating layer 41 and the adhesive layer 42 are alternately arranged. Both the coating layer 41 and the adhesive layer 42 are organic layers.

In the display panel 100 of the embodiment of the present disclosure, a cutting process is performed in a manufacturing process of the panel, so that a roughness of the second surface 1*b* (the side surface) of the driving substrate 10 is relatively large. Thus, the coating layer 41 and the adhesive layer 42 using organic materials can, on the one hand, flatten the roughness of the second surface 1*b*, so as to improve an integrity of the coating layer 41 and the adhesive layer 42, and further improve an encapsulation performance. On the other hand, the two are alternately arranged to be closely connected, which can further improve the encapsulation performance. In addition, the setting of the coating layer 41 can also reduce a thickness of the second encapsulation structure 40. The adhesive layer 42 can also absorb external stress for protecting the coating layer 41.

The display panel and the splicing panel provided by the embodiments of the present disclosure are described above in detail. The principles and implementations of the present disclosure are described in this specification by using specific examples, and the descriptions of the above embodiments are only used to help understand the method and the core idea of the present disclosure. Meanwhile, for those skilled in the art, according to the idea of the present disclosure, there will be changes in the specific implementation manner and application scope. In conclusion, the content of this specification should not be construed as a limitation on the present disclosure.

What is claimed is:

1. A display panel, comprising:

a driving substrate comprising a first surface and a second surface, wherein an extending direction of the first surface intersects with an extending direction of the second surface, the first surface is a front surface of the driving substrate, and the second surface is a side surface of the driving substrate;

a light-emitting device disposed on the first surface of the driving substrate;

a first encapsulation structure covering the first surface, and encapsulating the light-emitting device; and a second encapsulation structure comprising at least one coating layer and at least one adhesive layer, wherein one of the coating layer and the adhesive layer directly covers the second surface of the driving substrate; in a vertical direction of the second surface of the driving substrate, the coating layer and the adhesive layer are alternately arranged, and both the coating layer and the adhesive layer are organic layers;

wherein the first encapsulation structure comprises a first front encapsulation layer and a second front encapsulation layer, and an elastic modulus of the first front encapsulation layer is less than an elastic modulus of the second front encapsulation layer; the first front encapsulation layer is an organic layer, and the first front encapsulation layer covers the first surface of the driving substrate and encapsulates the light-emitting device;

wherein the coating layer comprises a first coating layer, the adhesive layer comprises a first adhesive layer, the first coating layer directly covers the second surface of the driving substrate and a side surface of the first front encapsulation layer, and the first coating layer directly covers a surface of the first front encapsulation layer away from the driving substrate;

wherein the second front encapsulation layer is disposed on a surface of the first coating layer away from the driving substrate, and the first adhesive layer covers a side surface of the first coating layer and a side surface of the second front encapsulation layer.

2. The display panel according to claim 1, wherein an outermost layer of the second encapsulation structure is the adhesive layer.

3. The display panel according to claim 1, wherein a thickness of the coating layer is less than or equal to 50 micrometers.

4. The display panel of claim 1, wherein the coating layer further comprises a second coating layer, and the second coating layer covers at least a side surface of the first adhesive layer and a surface of the second front encapsulation layer away from the driving substrate.

5. The display panel according to claim 4, wherein the adhesive layer further comprises a second adhesive layer, and the second adhesive layer covers a side surface of the second coating layer.

6. The display panel according to claim 1, wherein a surface roughness of the coating layer and a surface roughness of the adhesive layer are both less than a surface roughness of the second surface.

7. A splicing panel, comprising at least two display panels, wherein the display panels are spliced, and each of the display panel comprises a driving substrate comprising a first surface and a second surface, wherein an extending direction of the first surface intersects with an extending direction of the second surface, the first surface is a front surface of the driving substrate, and the second surface is a side surface of the driving substrate;

a light-emitting device disposed on the first surface of the driving substrate;

a first encapsulation structure covering the first surface, and encapsulating the light-emitting device; and a second encapsulation structure comprising at least one coating layer and at least one adhesive layer, wherein one of the coating layer and the adhesive layer directly covers the second surface of the driving substrate; in a vertical direction of the second surface of the driving substrate, the coating layer and the adhesive layer are alternately arranged, and both the coating layer and the adhesive layer are organic layers;

wherein the first encapsulation structure comprises a first front encapsulation layer and a second front encapsulation layer, and an elastic modulus of the first front encapsulation layer is less than an elastic modulus of the second front encapsulation layer; the first front encapsulation layer is an organic layer, and the first front encapsulation layer covers the first surface of the driving substrate and encapsulates the light-emitting device;

wherein the coating layer comprises a first coating layer, the adhesive layer comprises a first adhesive layer, the first coating layer directly covers the second surface of the driving substrate and a side surface of the first front encapsulation layer, and the first coating layer directly covers a surface of the first front encapsulation layer away from the driving substrate;

wherein the second front encapsulation layer is disposed on a surface of the first coating layer away from the driving substrate, and the first adhesive layer covers a side surface of the first coating layer and a side surface of the second front encapsulation layer.

8. The splicing panel according to claim 7, wherein an outermost layer of the second encapsulation structure is the adhesive layer.

9. The splicing panel according to claim 7, wherein a thickness of the coating layer is less than or equal to 50 micrometers.

10. The display panel of claim 7, wherein the coating layer further comprises a second coating layer, and the second coating layer covers at least a side surface of the first adhesive layer and a surface of the second front encapsulation layer away from the driving substrate.

11. The splicing panel according to claim 10, wherein the adhesive layer further comprises a second adhesive layer, and the second adhesive layer covers a side surface of the second coating layer.

12. The splicing panel according to claim 7, wherein a surface roughness of the coating layer and a surface roughness of the adhesive layer are both less than a surface roughness of the second surface.

* * * * *